US012628452B2

(12) United States Patent
Lyngnes et al.

(10) Patent No.: US 12,628,452 B2
(45) Date of Patent: May 12, 2026

(54) ELECTRONIC DEVICES HAVING SEMICONDUCTOR SENSORS WITH METAL OPTICAL FILTERS

(71) Applicant: Apple Inc., Cupertino, CA (US)

(72) Inventors: Ove Lyngnes, Carmel Valley, CA (US); Paul J Gelsinger, Santa Clara, CA (US); Yijing Chen, San Diego, CA (US); Guocheng Shao, Palo Alto, CA (US); Louis W Baum, Mountain View, CA (US); Kenneth J Vampola, Los Altos, CA (US); Avery P Yuen, Campbell, CA (US)

(73) Assignee: Apple Inc., Cupertino, CA (US)

( * ) Notice: Subject to any disclaimer, the term of this patent is extended or adjusted under 35 U.S.C. 154(b) by 449 days.

(21) Appl. No.: 18/191,438

(22) Filed: Mar. 28, 2023

(65) Prior Publication Data

US 2023/0402472 A1     Dec. 14, 2023

Related U.S. Application Data

(60) Provisional application No. 63/350,994, filed on Jun. 10, 2022.

(51) Int. Cl.
*H10F 39/00*     (2025.01)
*H10F 39/18*     (2025.01)

(52) U.S. Cl.
CPC ......... *H10F 39/8053* (2025.01); *H10F 39/18* (2025.01); *H10F 39/8057* (2025.01)

(58) Field of Classification Search
CPC .. H10F 39/8053; H10F 39/18; H10F 39/8057; H10F 39/107; G01J 1/4204; G01J 1/0433; G01J 1/44; G01J 2001/446
See application file for complete search history.

(56) References Cited

U.S. PATENT DOCUMENTS

| | | | |
|---|---|---|---|
| 8,350,216 B2 | 1/2013 | Yao et al. | |
| 9,419,043 B2 | 8/2016 | Daamen et al. | |
| 9,477,263 B2 | 10/2016 | Hotelling et al. | |
| 10,512,157 B2 | 12/2019 | Guo et al. | |

(Continued)

FOREIGN PATENT DOCUMENTS

| | | |
|---|---|---|
| KR | 20110086552 A | 7/2011 |
| KR | 20200029026 A | 3/2020 |

*Primary Examiner* — Ratisha Mehta
*Assistant Examiner* — Sophia W Kao
(74) *Attorney, Agent, or Firm* — Treyz Law Group, P.C.; David K. Cole

(57)     ABSTRACT

An electronic device may include an ambient light sensor or other semiconductor sensor. The sensor may produce signals in response to light incident on the electronic device and therefore incident on the sensor. In some cases, components within the electronic device, such as infrared components, or external light sources may interfere with the operation of the sensor. Therefore, the sensor may include a filter that transmits at least a portion of visible light while blocking infrared light. Because light may be incident on the electronic device from a variety of angles, a diffuser in the sensor may scatter the light into a desired angular distribution. To ensure that infrared light is blocked regardless of the angle of the incident light, the filter may include both thin-film dielectric layers and metal layers. The metal layers may be interleaved with the thin-film dielectric layers.

16 Claims, 9 Drawing Sheets

(56)  References Cited

U.S. PATENT DOCUMENTS

| | | | |
|---|---|---|---|
| 10,537,269 | B2 | 1/2020 | Schaefer et al. |
| 10,670,786 | B2 | 6/2020 | Zheng et al. |
| 10,720,126 | B2 | 7/2020 | Bhat et al. |
| 10,739,189 | B2 | 8/2020 | Pacala et al. |
| 2015/0369980 | A1 | 12/2015 | Ockenfuss et al. |
| 2017/0284864 | A1 | 10/2017 | Chen |
| 2018/0081100 | A1* | 3/2018 | Wang ..................... G02B 5/285 |
| 2019/0080668 | A1* | 3/2019 | Holenarsipur ............ G01J 1/44 |
| 2019/0237500 | A1* | 8/2019 | Enichlmair ......... H10F 39/8053 |
| 2019/0312076 | A1* | 10/2019 | Schrems ............. H10F 39/8063 |
| 2022/0149105 | A1 | 5/2022 | Gäbler et al. |

* cited by examiner

ELECTRONIC DEVICES HAVING SEMICONDUCTOR SENSORS WITH METAL OPTICAL FILTERS

This application claims the benefit of provisional patent application No. 63/350,994, filed Jun. 10, 2022, which is hereby incorporated by reference herein in its entirety.

FIELD

This relates generally to electronic devices, and, more particularly, to electronic devices with optical components.

BACKGROUND

Electronic devices such as laptop computers, cellular telephones, and other equipment are sometimes provided with optical components. For example, an electronic device may have an ambient light sensor, an optical proximity sensor, image sensors, and light sources.

The desire to include multiple optical components in an electronic device can pose challenges. It can be difficult to incorporate optical components into an electronic device where space is at a premium. There is also a potential for different optical components to interfere with each other during operation.

SUMMARY

An electronic device may be provided with a display mounted in a housing. The display may have an active area with an array of pixels for forming images and may have an inactive area along one or more edges of the active area. Optical component windows may be formed in the inactive area, under the display in the active area, and/or in other portions of the electronic device. Optical components such as light-emitting diodes, image sensors, optical proximity sensors, and ambient light sensors may be aligned with the optical component windows.

An ambient light sensor may have a light detector integrated circuit with photodetectors. To provide the ambient light sensor with color sensing capabilities, the photodetectors may each be provided with a respective color filter configured to pass a different range of wavelengths.

A diffuser may be used to diffuse incoming ambient light. Infrared light-blocking filter layers may be use to block infrared light such as infrared light emitted by an infrared light-emitting diode in the electronic device and other stray or ambient infrared light.

To block infrared light regardless of its angle of incidence on the infrared-blocking filter, the filter may include both thin-film dielectric layers and metal layers. For example, the metal layers may be interleaved with the thin-film dielectric layers and block infrared light. Together, the thin-film dielectric layers and metal layers may form a pass band in at least some visible light wavelengths, while blocking infrared wavelengths.

DETAILED DESCRIPTION

Figure 1:
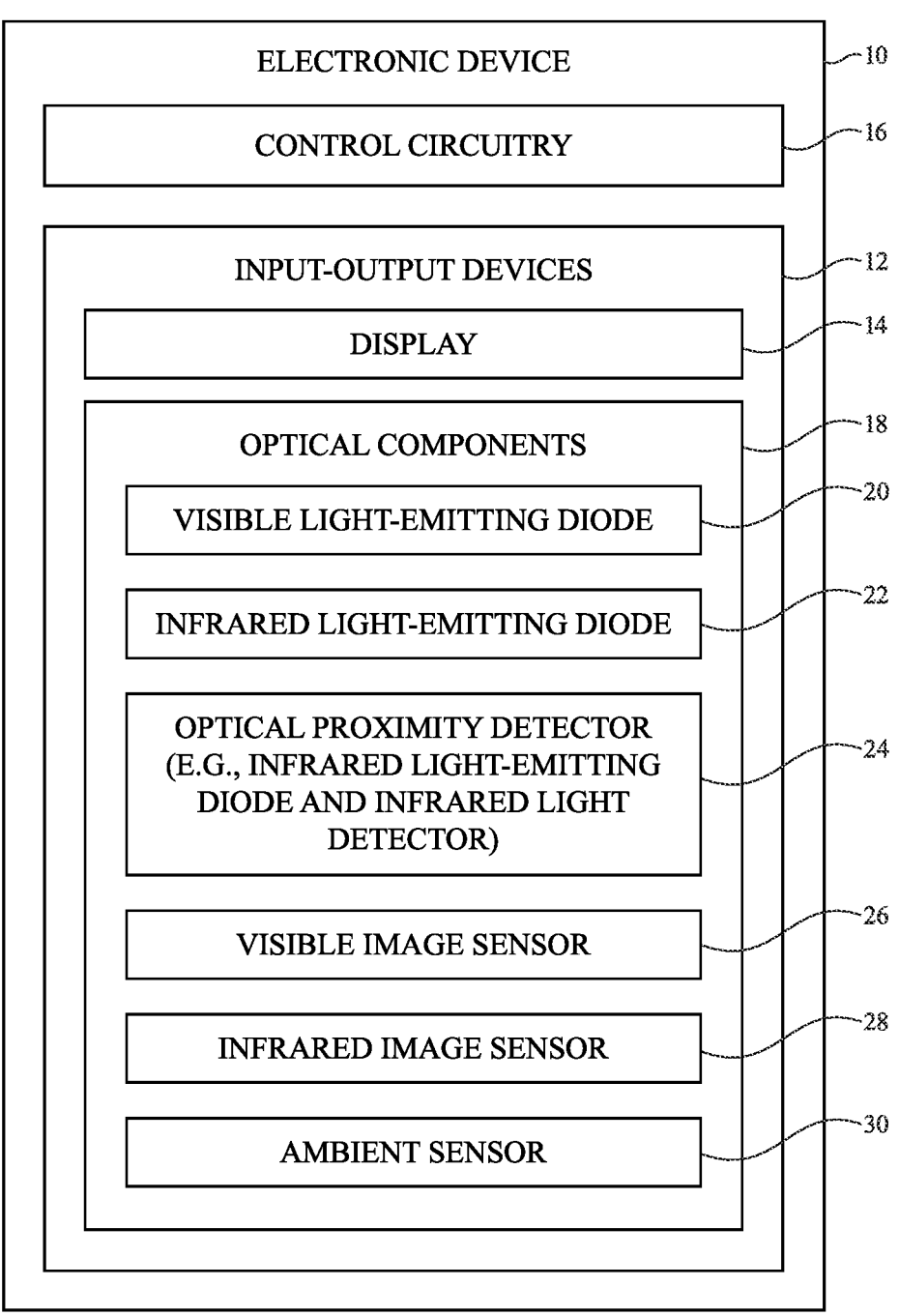
FIG. 1 is a schematic diagram of an illustrative electronic device having optical components in accordance with an embodiment.

An illustrative electronic device of the type that may be provided with optical components such as ambient light sensors or other semiconductor sensors is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Device 10 may have input-output circuitry such as input-output devices 12. Input-output devices 12 may include user input devices that gather user input and output components that provide a user with output. Devices 12 may also include communications circuitry that receives data for device 10 and that supplies data from device 10 to external devices. Devices 12 may also include sensors that gather information from the environment.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. Display 14 may be a liquid crystal display, a light-emitting diode display (e.g., an organic light-emitting diode display), an electrophoretic display, or other display.

Input-output devices 12 may include optical components 18. Optical components 18 may include light-emitting diodes and other light sources. As an example, optical components 18 may include one or more visible light-emitting diodes such as light-emitting diode 20. Light-emitting diode 20 may provide constant illumination (e.g., to implement a flashlight function for device 10) and/or may emit pulses of flash illumination for a visible light camera such as visible light image sensor 26. Optical components 18 may also include an infrared light source (e.g., a laser, lamp, light-emitting diode, etc.) such as infrared light-emitting diode 22. Infrared light-emitting diode 22 may provide constant and/or pulsed illumination at an infrared wavelength such as 940 nm, a wavelength in the range of 800-1100 nm, etc. For example, infrared-light-emitting diode 22 may provide constant illumination for an infrared camera such as infrared image sensor 28. Infrared image sensor 28 may, as an example, be configured to capture iris scan information from the eyes of a user and/or may be used to capture images for a facial recognition process implemented on control circuitry 16.

Optical components 18 may also include optical proximity detector 24 and ambient light sensor 30.

Optical proximity detector 24 may include an infrared light source such as an infrared light-emitting diode and a corresponding light detector such as an infrared photodetector for detecting when an external object that is illuminated by infrared light from the light-emitting diode is in the vicinity of device 10.

Ambient light sensor 30 may be a monochrome ambient light sensor that measures the intensity of ambient light or may be a color ambient light sensor that measures ambient light color and intensity by making light measurements with multiple photodetectors each of which is provided with a corresponding color filter (e.g., a corresponding bandpass filter that passes red light, blue light, yellow light, green light, or light of other colors) and each of which therefore responds to ambient light in a different wavelength band.

In addition to optical components 18, input-output devices 12 may include buttons, joysticks, scrolling wheels, touch pads, key pads, keyboards, microphones, speakers, tone generators, vibrators, cameras, light-emitting diodes and other status indicators, non-optical sensors (e.g., temperature sensors, microphones, capacitive touch sensors, force sensors, gas sensors, pressure sensors, sensors that monitor device orientation and motion such as inertial measurement units formed from accelerometers, compasses, and/or gyroscopes), data ports, etc. A user can control the operation of device 10 by supplying commands through input-output devices 12 and may receive status information and other output from device 10 using the output resources of input-output devices 12.

Figure 2:
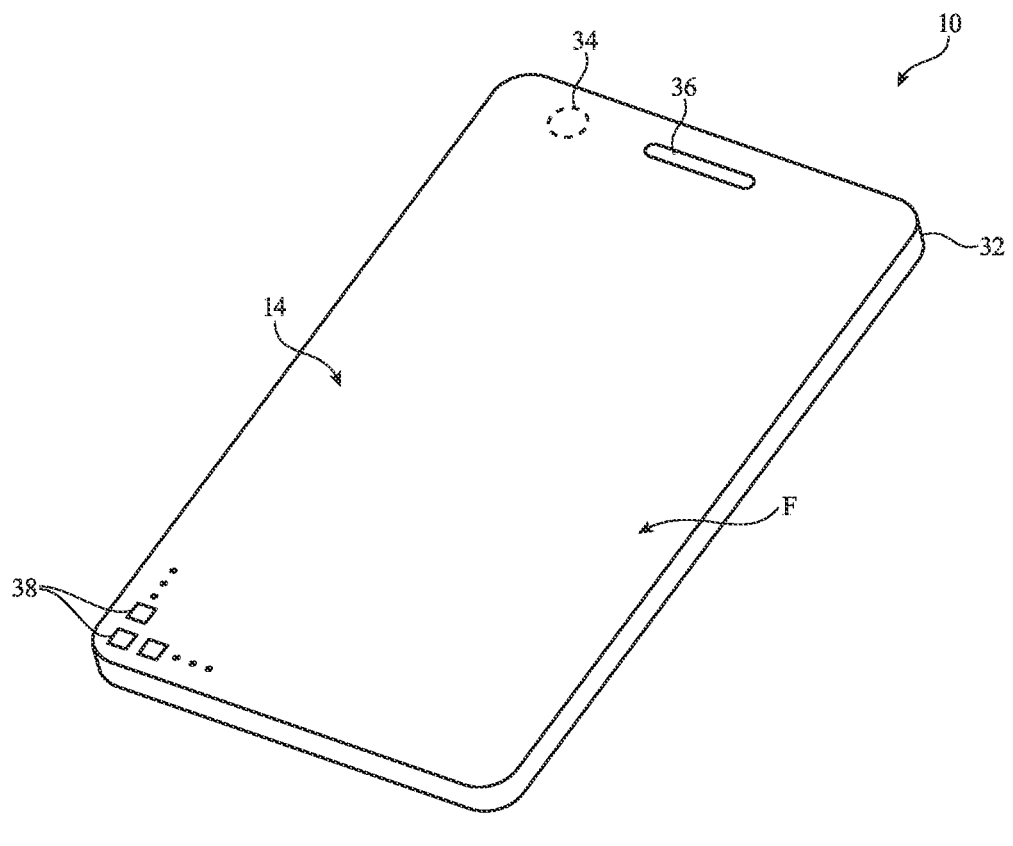
FIG. 2 is a perspective view of an illustrative electronic device with a display having optical component windows overlapping optical components in accordance with an embodiment.

Device 10 may have a housing. The housing may form a laptop computer enclosure, an enclosure for a wristwatch, a cellular telephone enclosure, a tablet computer enclosure, or other suitable device enclosure. A perspective view of a portion of an illustrative electronic device is shown in FIG. 2. In the example of FIG. 2, device 10 includes a display such as display 14 mounted in housing 32. Housing 32, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 32 may have any suitable shape. In the example of FIG. 2, housing 32 has a rectangular outline (footprint when viewed from above) and has four peripheral edges (e.g., opposing upper and lower edges and opposing left and right edges). Sidewalls may run along the periphery of housing 32.

Display 14 may be protected using a display cover layer such as a layer of transparent glass, clear plastic, sapphire, or other clear layer (e.g., a transparent planar member or transparent curved or partially curved member that forms some or all of a front face of device 10 or that is mounted in other portions of device 10). Openings may be formed in the display cover layer. For example, an opening may be formed in the display cover layer to accommodate a button, a speaker port such as speaker port 36, or other components. Openings may be formed in housing 32 to form communications ports (e.g., an audio jack port, a digital data port, etc.), to form openings for buttons, etc. In some configurations, housing 32 may have a rear housing wall. The rear housing wall may be formed from a glass member or other transparent layer, or may be formed from an opaque or translucent layer (e.g., a member formed on a rear face of device 10 opposing a front face of device 10 that includes a display cover layer).

Display 14 may have an array of pixels 38 that form an active area of the display (e.g., liquid crystal display pixels, organic light-emitting diode pixels, electrophoretic display pixels, etc.). Pixels 38 may display images for a user of device 10. The active area may be rectangular, may have notches along one or more of its edges, may be circular, may be oval, may be rectangular with rounded corners, may extend entirely between the sidewalls of housing 32, and/or may have other suitable shapes.

Inactive portions of display 14 such as an inactive border area that surrounds or is adjacent to the active area, may be formed along one or more edges of active area AA. The inactive border area may overlap circuits, signal lines, and other structures that do not emit light for forming images. To hide inactive circuitry and other components in the border area from view by a user of device 10, the underside of the outermost layer of display 14 (e.g., the display cover layer or other display layer) may be coated with an opaque masking material such as a layer of black ink (e.g., polymer containing black dye and/or black pigment, opaque materials of other colors, etc.) and/or other layers (e.g., metal, dielectric, semiconductor, etc.). Opaque masking materials such as these may also be formed on an inner surface of a planar rear housing wall formed from glass, ceramic, polymer, crystalline transparent materials such as sapphire, or other transparent material.

In the example of FIG. 2, speaker port 36 is formed from an elongated opening (e.g., a strip-shaped opening) that extends along a dimension parallel to the upper peripheral edge of housing 32. A speaker may be mounted within device housing 32 in alignment with the opening for speaker port 36. During operation of device 10, speaker port 34 serves as an ear speaker port for a user of device 10 (e.g., a user may place opening 34 adjacent to the user's ear during telephone calls). However, speaker port 34 is merely illustrative. In general, device 10 may have no speaker ports or more than one speaker port, if desired.

Optical components 18 (e.g., a visible digital image sensor, an infrared digital image sensor, a light-based proximity sensor, an ambient light sensor, visible and/or infrared light-emitting diodes that provide constant and/or pulsed illumination, etc.) may be mounted under one or more optical component windows such as optical component window 34. In the example of FIG. 2, window 34 has a circular outline (e.g., circular footprints when viewed from above). In general, however, optical component windows in device 10 may have any desired shapes. Moreover, optical component windows in device 10 may be formed in the active area or inactive area of display 14. Additionally, although FIG. 2 shows optical component windows on front face F, one or more windows may be formed on other portions of device 10, such as a rear face or sidewall, if desired. The examples of FIG. 2 are merely illustrative.

If optical component windows are formed in the inactive area of display 14, opaque masking layer may be formed on the underside of the display cover layer in the inactive area, and the optical windows may be formed from openings within the opaque masking layer. To help the optical windows visually blend with the opaque masking layer, a dark ink layer, a metal layer, a thin-film interference filter formed from a stack of dielectric layers, and/or other structures may overlap the optical windows.

Regardless of where the optical component windows, such as optical component window 34, are formed, any desired optical components may receive light through the windows. In one example, device 10 may have one or more ambient light sensors that operate through one or more optical component windows. In other words, the ambient light sensors may receive ambient light through the optical component windows.

Figure 3:
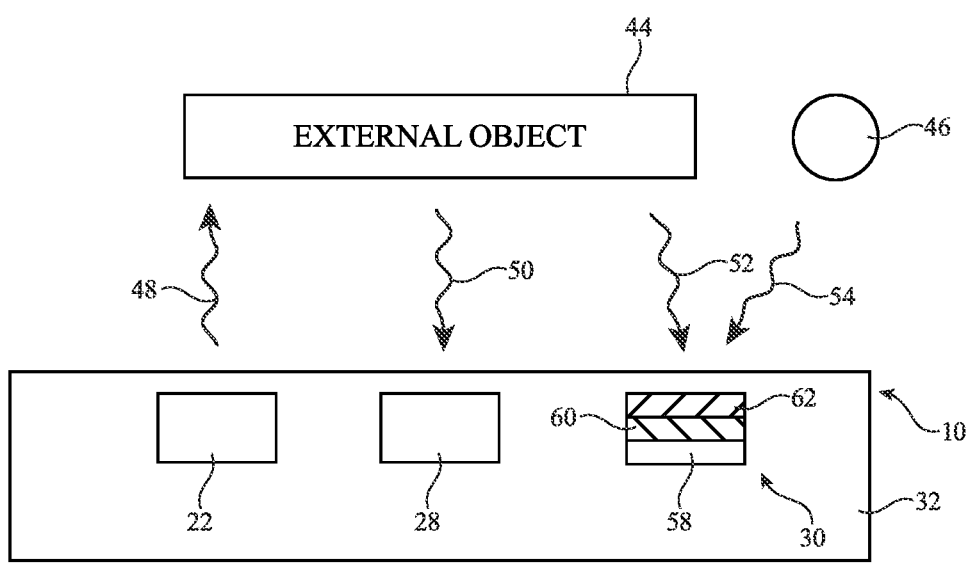
FIG. 3 is a side view of an illustrative electronic device that has optical components such as a light source, image sensor, and ambient light sensor in accordance with an embodiment.

In some modes of operation, device 10 may emit infrared light that has the potential to interfere with ambient light sensor operation. Consider, as an example, a scenario in which control circuitry 16 of device 10 is using infrared image sensor 28 to capture eye scan information and/or facial images (e.g., images of a user's face for use in performing face recognition operations to authenticate the user of device 10). As shown in FIG. 3, to ensure that the eyes and/or face of a user are sufficiently illuminated, device 10 may use infrared light source 22 (e.g., an infrared light-emitting diode, an infrared laser, etc.) to produce infrared light 48. Light 48 may illuminate external objects in the vicinity of device 10 such as external object 44 (e.g., a user's face and/or eyes). Reflected infrared light 50 from external object 44 may be received and imaged using infrared digital image sensor 28 to produce infrared images of the face and/or eyes.

While reflected infrared light 50 is being imaged, stray infrared light reflected from object 44 such as stray infrared light 52 may be present at ambient light sensor 30. To ensure that stray infrared light 52 does not interfere with the ambient light measurements being made with ambient light sensor 30, ambient light sensor 30 may have an infrared blocking filter such as filter 60. Filter 60 may be formed from materials that are transparent to visible light and that block infrared light such as thin-film interference filters formed from stacks of dielectric layers configured to block infrared light (e.g., infrared light at the wavelengths associated with stray light 52 and, if desired, additional infrared wavelengths) while passing visible light.

Ambient light 54 may be present in the surroundings of device 10 and may include light emitted from a light source such as light source 46 (e.g., the sun, a lamp, etc.). In some situations, ambient light 54 may be directional (e.g., the rays of light 54 from light source 46 may be aligned in a particular direction due to the nature of light source 46). To ensure that the response of ambient light sensor 30 is even over a range of different orientations relative to light source 46 and ambient light 54, a light diffuser such as diffuser 62 may be incorporated into ambient light sensor 30. Ambient light sensor 30 may have one or more photodetectors (e.g., photodiodes) and associated amplifier and digitizing circuitry implemented on light detector integrated circuit 58. Diffuser 62 may overlap visible-light-transmitting-and-infrared-light-blocking filter layer 60 and integrated circuit 58.

Although ambient light sensor 30 has been described as being sensitive to visible light and being overlapped by visible-light-transmitting-and-infrared-light-blocking filter 60, this is merely illustrative. In general, sensor 30 may detect any desired wavelength of light and have an appropriate filter 60. For example, sensor 30 may be an infrared light sensor and may have a filter 60 that filters out some or all visible light and/or some infrared light.

Figure 4:
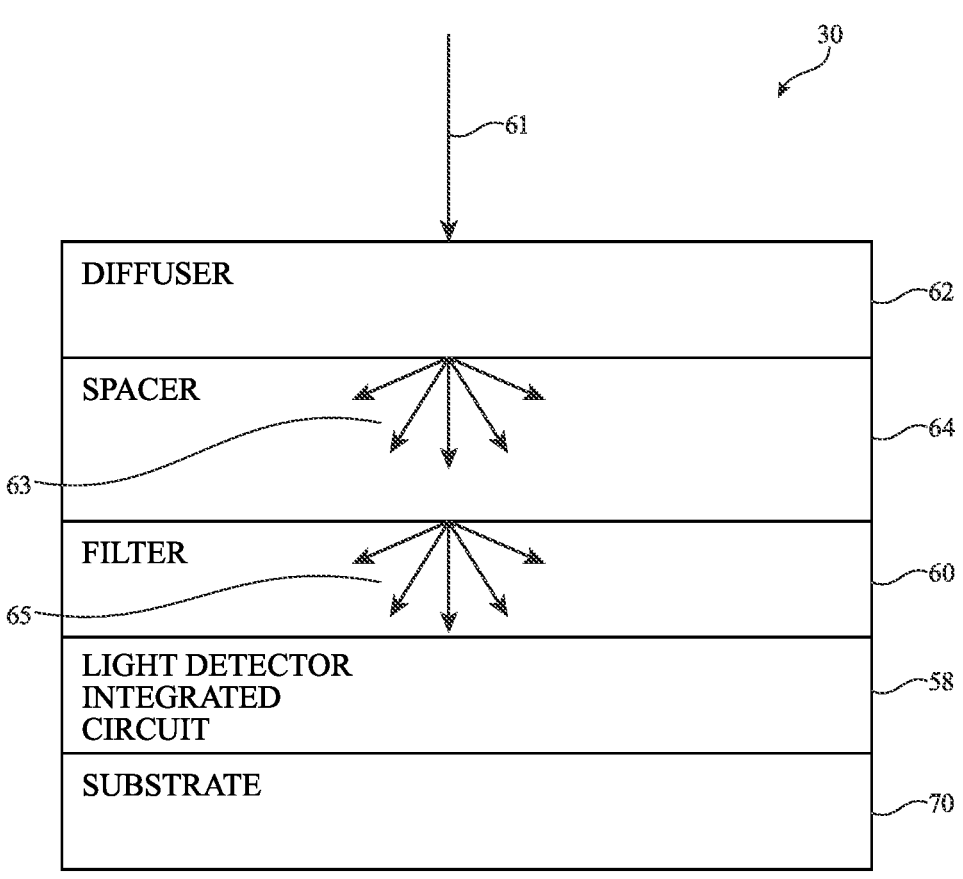
FIG. 4 is a side view of an illustrative semiconductor sensor in accordance with an embodiment.

A side view of an illustrative ambient light sensor that may be included in a device, such as electronic device 10, is shown in FIG. 4. In particular, ambient light sensor 30 may be formed on substrate 70. Substrate 70 may be a semiconductor substrate, such as a silicon substrate. Light detector integrated circuit 58 may be formed on substrate 70. Light detector integrated circuit 58 may detect incident light and produce signals in response to the incident light. If desired, each of these layers may be formed directly on one another, or other layers may be included between at least some of the layers. In some embodiments, substrate 70 may be a substrate, such as a silicon substrate, on which light detector integrated circuit 58 is grown and fabricated. Alternatively, light detector integrated circuit 58 may be grown and fabricated on a separate substrate that is then coupled to substrate 70.

Figure 5:
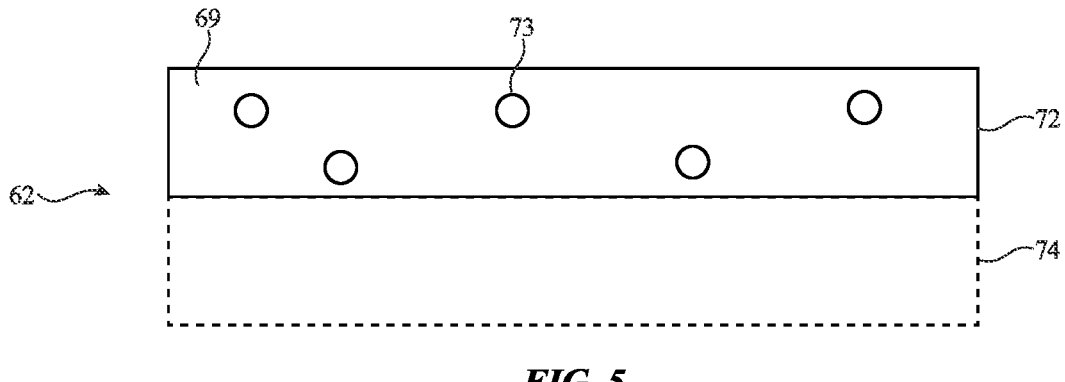
FIG. 5 is a side view of an illustrative diffuser in accordance with an embodiment.

To ensure that the response of ambient light sensor 30 (e.g., light detector circuit 58) is even over a range of different orientations relative to incoming light 61, a light diffuser such as diffuser 62 may be incorporated into ambient light sensor 30. Diffuser 62 may be formed from one or more layers of polymer, glass, or other suitable materials. In one example, as shown in FIG. 5, diffuser 62 may be formed from diffuser layer 72 on optional substrate 74. Substrate 74 may be formed from clear glass, transparent polymer, or other suitable substrate material.

Diffuser layer 72 may be formed from polymer (e.g., clear binder such as a transparent polymer resin) such as polymer 69 and may include light-scattering particles 73 embedded in polymer 69. Light-scattering particles 73 may be titanium oxide particles or other particles with a refractive index that is different from the refractive index of polymer 69. In particular, particles 73 may have a refractive index that is greater than or less than the refractive index of polymer 69. If desired, light-scattering particles 73 may also be incorporated into substrate 74. Light-scattering coatings formed from polymer with embedded light-scattering particles may also be formed on a display cover layer, light guide structures, filter layers, and/or other transparent materials in device 10. If desired, light-scattering features such as protrusions and/or recesses may be included in one or more of the layers of material forming diffuser 62. These light-scattering features may be included in addition to or instead of the light-scattering particles. If desired, diffuser 62 may include any number of diffuser layers 72 and (if desired) optional substrates 74. In general, any suitable number of diffuser layers 72 may be included in diffuser 62 (e.g., one, at least two, at least three, etc.).

As shown in FIG. 4, diffuser 62 may diffuse incoming light 61 into light distribution 63. For example, light distribution 63 may be a Lambertian angular distribution, or may be any other desired light distribution. After being diffused, diffuse light 63 may then proceed through spacer 64. However, spacer 64 may be omitted, if desired, in which case diffuse light 63 may proceed directly through filter 60. Spacer 64 may be formed from any desired material, such as glass, sapphire, polyethylene terephthalate (PET), or any other desired material. In some examples, it may be desirable to form spacer 64 from a material with a refractive index of 1.5, approximately 1.5, between 1.2 and 1.5, or between 1.5 and 1.7. However, in general, spacer 64 may have any desired refractive index.

After passing through spacer 64 (or after passing through diffuser 62 in embodiments in which spacer 64 is omitted), light may have light distribution 65, which is similar to light distribution 63. In particular, the refractive index of spacer 64 may be similar to the refractive index of diffuser 62 (e.g., within 0.2, 0.3, or any other desired value), and therefore may maintain a similar angular distribution. As a result, if light distribution 63 is a Lambertian angular distribution, light distribution 65 may also be substantially Lambertian.

To ensure that light reaching light detector integrated circuit 58 is visible light and free from infrared light that may interfere with the ambient light sensor, visible-light-transmitting-and-infrared-light-blocking filter 60 may filter light 65 before being detected by the underlying circuitry. In general, filter 60 may be any desired filter that blocks infrared light while passing visible light.

Although filter 60 has been described as filtering infrared light and transmitting visible light, this is merely illustrative. For example, if sensor 30 (FIG. 3) is sensitive to non-visible light wavelengths, such as infrared wavelengths, filter 60 may filter some or all visible light and/or some infrared light. In general, filter 60 may filter any desired wavelength(s) of light. One illustrative example of filter 60 is shown in FIG. 6.

Figure 6:
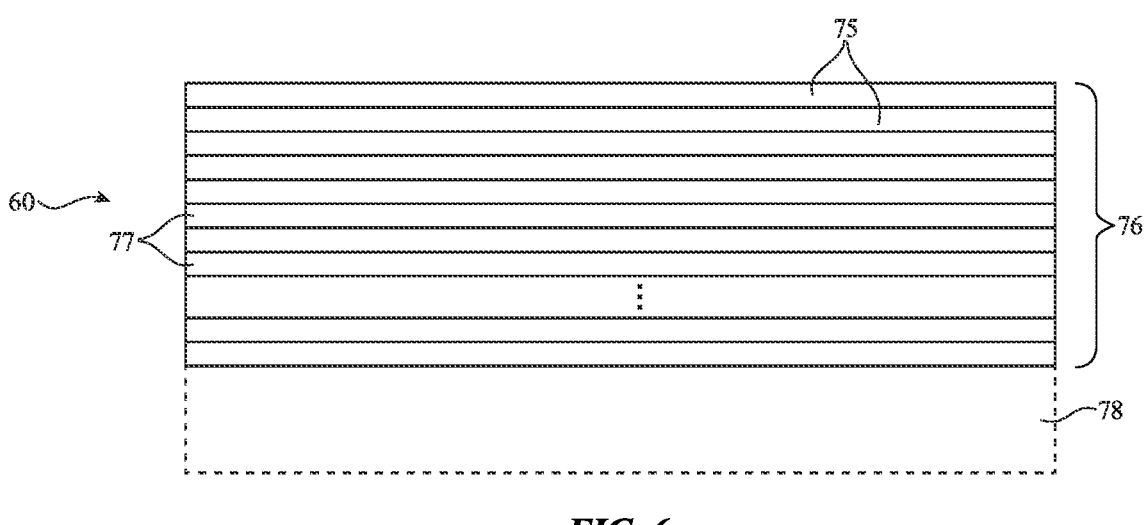
FIG. 6 is a side view of an illustrative filter in accordance with an embodiment.

As shown in FIG. 6, filter 60, which may be an infrared-light-blocking-and-visible-light transmitting filter (sometimes referred to as an infrared-light-blocking filter, infrared-blocking filter, filter, etc.) may be formed from filter stack 76 on optional substrate 78. Substrate 78 may be a polymer or glass layer that is transparent at visible wavelengths. Substrate 78 may be transparent at infrared wavelengths or may block infrared light. Filter stack 76 may include thin-film dielectric layers 75 such as inorganic dielectric layers with alternating high and low refractive index values (for example, the low refractive index values may be between 1.2 and 1.8 and the high refractive index values may between 1.9 and 2.9, as examples). Layers 75 may, for example, be formed from inorganic dielectric materials such as silicon oxide, silicon nitride, niobium oxide, tantalum oxide, titanium oxide, aluminum oxide, indium tin oxide, etc., and/or may be formed from organic dielectric materials. There may be any suitable number of layers 75 in each dielectric stack (e.g., at least 5, at least 10, at least 30, at least 40, 20-90, fewer than 100, etc.).

Although thin-film dielectric layers 75 may form a filter that blocks IR light, layers 75 may be less effective at doing so at high angles of incidence. Because light 65 may have a high angle of incidence on filter 60 after passing through diffuser 62 and spacer 64 (see FIG. 4), it may be desirable to incorporate other layers into filter 60 to block high-angle IR light (or light of other desired wavelengths). In particular, one or more metal layers 77 may be incorporated into filter 60.

As shown in FIG. 6, metal layers 77 may be interleaved with at least some of the thin-film dielectric layers 75. Metal layers 77 may be formed from silver, aluminum, gold, and/or any other desired metal layer, and/or any desired metal alloy. For example, a single metal layer 77 may be formed from a combination of silver, aluminum, gold, and/or any other desired metal, or may be formed from a single metal (such as silver, aluminum, gold, or any other desired metal). If desired, if multiple metal layers 77 are included in filter stack 76, the metal layers 77 may all be formed from the same composition (i.e., the same single metal or combination of metals), or some or all of the metal layers 77 in filter stack 76 may have different compositions (i.e., may be formed from different single metals or combinations of metals).

In general, the one or more metal layers 77 may be positioned anywhere within filter stack 76 and may have any desired thicknesses. In some examples, two or more metal layers 77 with thicknesses greater than 5 nm and less than 100 nm may be incorporated into filter stack 76. In some embodiments, one or more additional metal layers may be placed on either or both sides of metal layer 77. These additional metal layers may be included for their optical properties, mechanical properties, or to promote good adhesion amongst the layers.

Although FIG. 6 shows multiple metal layers 77 interleaved with dielectric layers 75, this is merely illustrative. In some examples, a single metal layer 77 may be included in filter stack 76. The single metal layer 77 may have dielectric layers 75 above and below the metal layer, or single metal layer 77 may be formed on the bottom or top of filter stack 76. Alternatively, multiple metal layers 77 may be used, and at least some of metal layers 77 may be in contact with one another. For example, at least some of metal layers 77 may be in direct contact without interleaved dielectric layers. However, these examples are merely illustrative. In general, metal layers 77 may be incorporated into filter stack 76 in any desired manner.

By incorporating one or more metal layers 77 into filter stack 76, filter 60 may transmit visible light while blocking infrared light (or may transmit another wavelength of interest, such as infrared light, while blocking undesired wavelengths). An illustrative transmission spectrum of filter 60 is shown in FIG. 7.

Figure 7:
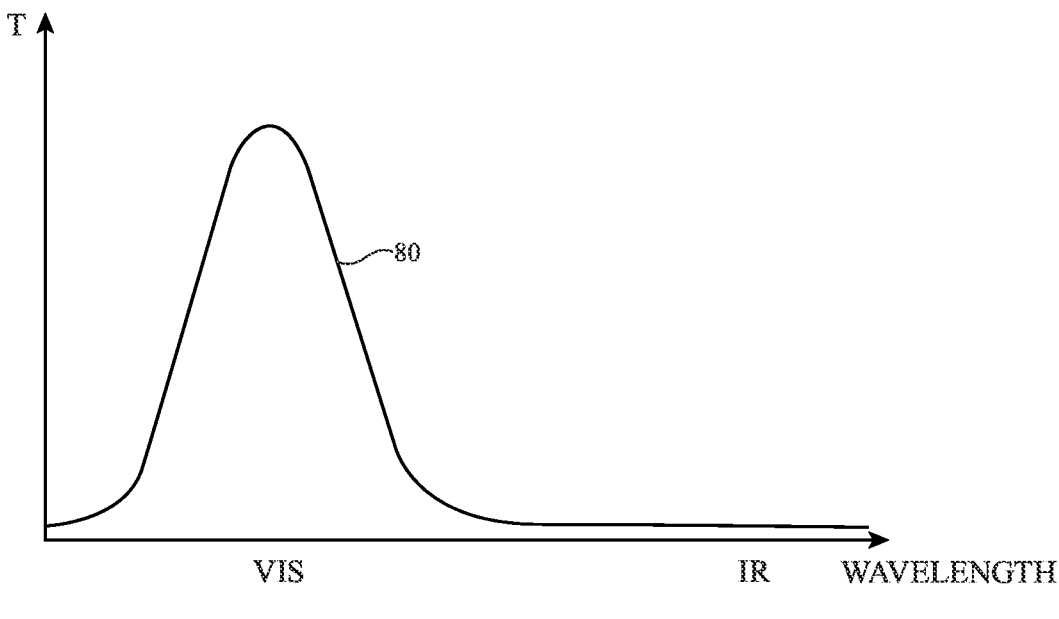
FIG. 7 is a graph of an illustrative transmission profile as a function of wavelength for a filter in accordance with an embodiment.

As shown in FIG. 7, an illustrative transmission profile of light passing through filter 60 may be given by curve 80. Curve 80 shows that filter 60 has a pass band in at least a portion of the visible light spectrum, while having low or no transmission at lower (e.g., ultraviolet) and higher (e.g., infrared) wavelengths. For example, filter 60 may have a pass band from 500 nm to 600 nm, with a peak transmission of at least 15% at approximately 550 nm. Filter 60 may transmit less than 5%, less than 2%, or less than 1% of light at wavelengths over 700 nm and under 400 nm. In other words, filter 60 may block at least 95%, at least 98%, or at least 99% of infrared light. However, these transmissions and blocking ranges are merely illustrative. In general, filter 60 may transmit at least a portion of visible light while blocking infrared light (i.e., may be a band pass filter that passes visible light). In this way, infrared light may be prevented from reaching the underlying light detector circuitry, while allowing for detection of visible light. This may reduce or prevent interference with the ambient light sensor from infrared light.

Although the transmission profile of FIG. 7 shows filter 60 transmitting visible light while reflecting infrared light, this is merely illustrative. In general, filter 60 may have any desired transmission spectrum. For example, if sensor 30 (FIG. 3) is sensitive to non-visible light, filter 60 may block some or all visible light and/or transmit some or all infrared light.

If desired, the layers within an ambient light sensor, such as ambient light sensor 30 of FIG. 4, may be stacked without any air gaps or gaps filled with other substances. Herein, "air gaps" may refer to either air gaps or gaps filled with other substances, such as gases, inert gases, vacuum, etc. For example, as shown in FIG. 4, substrate 70, light detector integrated circuit 58, filter 60, spacer 64, and diffuser 62 may be stacked without any intervening air gaps or other gaps. However, this is merely illustrative. Air gaps or gaps filled with other substances (e.g., gases, such as inert gases, or vacuum) may be incorporated between some of the layers, if desired.

In general, ambient light sensors in device 10, such as ambient light sensor 30, may have light detector circuitry arranged in any desired manner. For example, light detector circuitry, such as light detector circuitry 58, in an ambient light sensor may have one or more photodetectors. If the ambient light sensor is a monochrome ambient light sensor, a single photodetector may be used, although more may be used, if desired. In the case of a color ambient light sensor, multiple photodetectors, each having an overlying color filter (i.e., to pass a desired color of visible light), may be used. Arrangements of illustrative ambient light sensors are shown in FIGS. 8A and 8B.

Figure 8A:
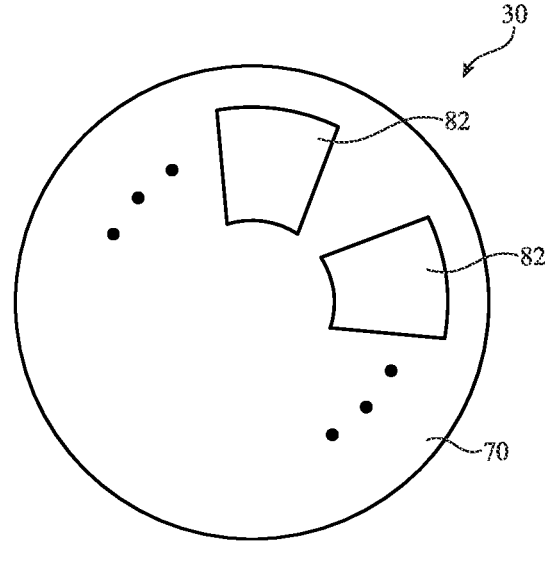
FIG. 8A is a top view of an illustrative ambient light sensor integrated circuit having a set of photodetectors with a circular outline in accordance with an embodiment.

An illustrative circular photodetector layout is shown in FIG. 8A. In particular, an ambient light sensor, such as ambient light sensor 30, may have photodetectors 82. As shown in FIG. 8A, photodetectors 82 may extend around substrate 70 in a circular manner. Any desired number of photodetectors may be arranged in this manner. An illustrative elongated rectangular layout for photodetectors 82 is shown in FIG. 8B. In FIG. 8B, photodetectors 82 are arranged in two rows on substrate 70. However, this is merely illustrative. In general, any desired number of photodetectors may be arranged on substrate 70 in any desired manner.

Figure 8B:
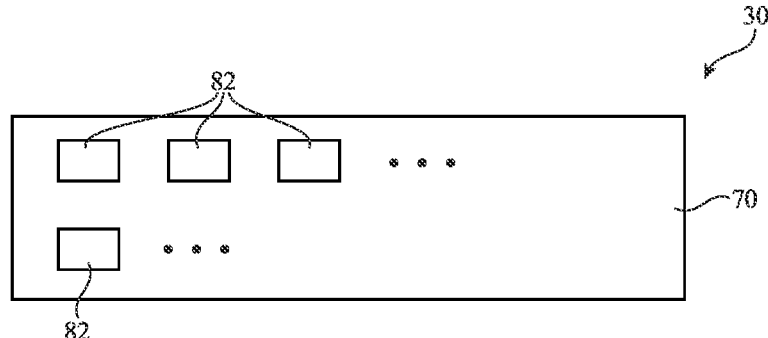
FIG. 8B is a top view of an illustrative ambient light sensor having a set of photodetectors with a rectangular outline in accordance with an embodiment.

In arrangements of the type shown in FIGS. 8A and 8B, photodetectors for different color channels can be distributed throughout sensor 30 and, if desired, redundant photodetectors (e.g., photodetectors measuring the same color of ambient light) may be included in ambient light sensor 30. As an example, photodetectors 82 of FIG. 8A and/or FIG. 8B may include photodetectors for 3-10 different color channels (including an optional clear color channel) and each color channel may have 1-5 different individual photodetectors 82 for gathering ambient light color readings for that color channel. Circuitry in integrated circuit 58 (e.g., switching circuitry, amplifier circuitry, analog-to-digital conversion circuitry, communications circuitry for supporting communications with control circuitry elsewhere in device 10, etc.) may be incorporated into integrated circuit 58 with photodetectors 82 or, if desired, some or all of this supporting circuitry for photodetectors 82 may be formed in one or more integrated circuits that are separate from integrated circuit 58.

Regardless of the arrangement of photodetectors within an ambient light sensor, the photodetectors may be overlapped by a diffuser and a filter, such as diffuser 62 and filter 60. Two illustrative embodiments are shown in FIGS. 9A and 9B.

Figure 9A:
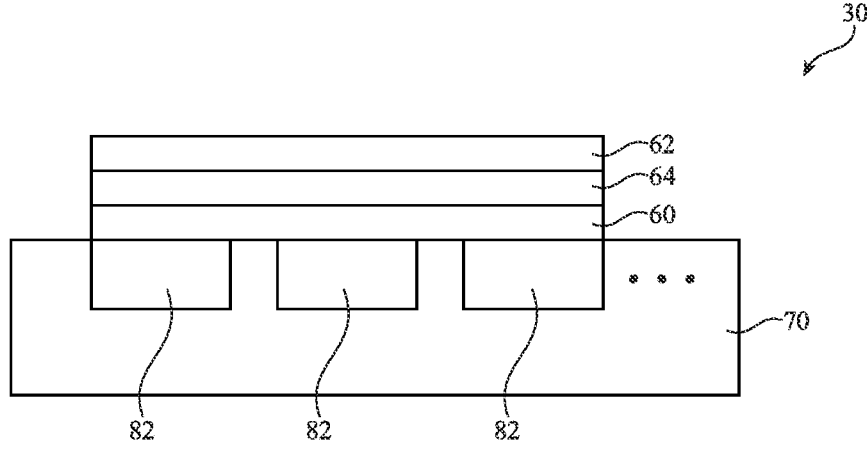
FIG. 9A is a side view of an illustrative ambient light sensor having a stack of a diffuser, a spacer, and a filter overlapping multiple photodetectors in accordance with an embodiment.
Figure 9B:
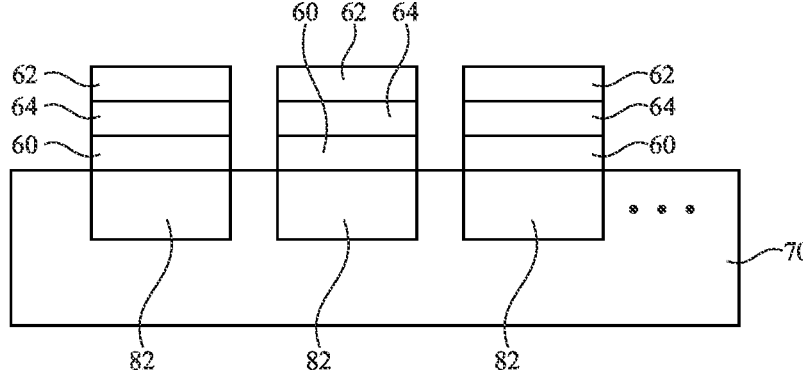
FIG. 9B is a side view of an illustrative ambient light sensor having individual stacks of a diffuser, a spacer, and a filter, each stack overlapping a respective photodetector in accordance with an embodiment.

As shown in FIG. 9A, multiple photodetectors 82 in ambient light sensor 30 may be overlapped by a shared diffuser and filter. For example, diffuser 62, filter 60, and spacer 64 may overlap some or all of photodetectors 82. Alternatively or additionally, individual photodetectors in ambient light sensor 30 may have corresponding diffusers and/or filters. An example of this arrangement is shown in FIG. 9B, where each photodetector 82 has its own diffuser 62, filter 60, and spacer 64. However, this is merely illustrative. In some examples, each photodetector 82 may have its own filter 60, while a single diffuser 62 may overlap multiple photodetectors 82. In general, a given diffuser and filter may overlap any number of photodetectors of an ambient light sensor within device 10.

As described above, one aspect of the present technology is the gathering and use of information such as sensor information. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to have control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. An ambient light sensor configured to provide ambient light measurements to control circuitry in an electronic device, the ambient light sensor comprising:
   a substrate;
   a light detector integrated circuit on the substrate; and
   a filter on the light detector integrated circuit, wherein the filter comprises a thin-film interference filter that includes a plurality of thin-film dielectric layers and multiple metal layers interleaved with the plurality of thin-film dielectric layers.

2. The ambient light sensor defined in claim 1, further comprising:
   a diffuser, wherein the filter is interposed between the diffuser and the substrate.

3. The ambient light sensor defined in claim 2, wherein the thin-film interference filter is a band pass filter.

4. The ambient light sensor defined in claim 3, wherein the multiple metal layers comprises at least one of a silver layer, an aluminum layer, or a gold layer.

5. The ambient light sensor defined in claim 4, wherein the plurality of thin-film dielectric layers comprises a stack of dielectric layers with alternating high and low indices of refraction.

6. The ambient light sensor defined in claim 3, wherein the band pass filter is configured to pass a respective range of visible light wavelengths while blocking at least 95% of infrared light.

7. The ambient light sensor defined in claim 2, wherein the light detector integrated circuit comprises a plurality of photodetectors.

8. The ambient light sensor defined in claim 7, wherein the filter and the diffuser overlap the plurality of photodetectors.

9. The ambient light sensor defined in claim 7, wherein the filter is one of a plurality of filters that each respectively overlaps a given one of the plurality of photodetectors and wherein the diffuser overlaps the plurality of photodetectors.

10. An electronic device, comprising:
    a transparent layer;
    an optical component window in a portion of the transparent layer through which light passes; and
    a light sensor aligned with the optical component window, wherein the light sensor comprises:
       a substrate;
       a light detector integrated circuit on the substrate;
       a filter that overlaps the light detector integrated circuit, wherein the filter comprises a metal layer;
       a diffuser, wherein the filter is interposed between the diffuser and the substrate; and
       a spacer between the diffuser and the filter and wherein the spacer, the diffuser, and the filter are stacked on the substrate and the light detector integrated circuit, wherein the spacer extends across the filter from a first edge to a second edge.

11. The electronic device defined in claim 10, wherein the filter is a thin-film interference filter that further comprises a stack of thin-film dielectric layers.

12. The electronic device defined in claim 11, wherein the metal layer is interposed between thin-film inorganic dielectric layers of the stack of thin-film dielectric layers.

13. The electronic device defined in claim 12, wherein the thin-film dielectric layers have alternating high and low indices of refraction.

14. A semiconductor device configured to generate signals in response to incident light, comprising;
    a substrate;
    a light detector integrated circuit on the substrate;
    a diffuser that overlaps the substrate and the light detector integrated circuit; and
    a filter interposed between the diffuser and the substrate, wherein the filter comprises a stack of thin-film dielectric layers with alternating high and low indices of refraction and a plurality of metal layers interleaved with the stack of thin-film dielectric layers.

15. The semiconductor device defined in claim 14, wherein the diffuser and the filter are coupled to the substrate and the light detector integrated circuit without any air gaps.

16. The semiconductor device defined in claim 14, wherein the filter is a band pass filter.

* * * * *